United States Patent
Tsui et al.

(10) Patent No.: US 6,208,030 B1
(45) Date of Patent: Mar. 27, 2001

(54) SEMICONDUCTOR DEVICE HAVING A LOW DIELECTRIC CONSTANT MATERIAL

(75) Inventors: Ting Y. Tsui, Palo Alto; Ercan Adem, Sunnyvale, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/179,410

(22) Filed: Oct. 27, 1998

(51) Int. Cl.$^7$ .................................................. H01L 23/48
(52) U.S. Cl. ............................................. 257/758; 258/759
(58) Field of Search .......................... 437/238; 257/634, 257/530, 759, 758

(56) References Cited

U.S. PATENT DOCUMENTS

| | | | |
|---|---|---|---|
| 4,001,049 | 1/1977 | Baglin et al. ............................. | 148/1.5 |
| 5,393,712 | * 2/1995 | Rostoker et al. ...................... | 437/238 |
| 5,598,026 | * 1/1997 | Kapoor et al. ......................... | 257/634 |
| 5,780,919 | * 7/1998 | Chua et al. ............................. | 257/530 |
| 5,892,269 | * 4/1999 | Inoue et al. ............................ | 257/634 |
| 6,008,540 | * 12/1999 | Lu et al. ................................. | 257/758 |

OTHER PUBLICATIONS

"Importance of Ionization Damage to Nuclear Waste Storage in Glass", J. DeNatale, et al., Am. Ceram. Soc. Bull. vol. 66, No. 9, (1987), pp. 1393–1396.

"Mechanism for the Radiolytically Induced Decomposition of Soda–Silicate Glasses", D. Howitt, et al., Journal of the American Ceramic Society, vol. 74, No. 5, May 1991, pp. 1145–1147.

"Development of Glass Ceramics for the Incorporation of Fission Products", De, et al., American Ceramic Society Bulletin, vol. 55, No. 5, (1976), pp. 500–503.

Preparation and Characterization of Porous Silica Xerogel Film for Low Dielectric Application, Hong, et al., Thin Solid Films, 308–309, (1997), 495–500.

"Effects of Alpha Decay on the Properties of Actual Nuclear Waste Glass", T. Banba, et al., Materials Research Society Symposium Proceedings, vol. 353, Scientific Basis for Nuclear Waste Management XVIII, pp. 1397–1404.

* cited by examiner

*Primary Examiner*—Eddie C. Lee
*Assistant Examiner*—Lourdes Cruz

(57) ABSTRACT

A semiconductor device having a reduced resistance-capacitance time constant is formed by treating a dielectric layer to reduce its dielectric constant. Embodiments include exposing a deposited dielectric layer to ionic radiation, as with Helium ion implantation, to form voids within the layer, thereby reducing its dielectric constant.

4 Claims, 2 Drawing Sheets

SEMICONDUCTOR DEVICE HAVING A LOW DIELECTRIC CONSTANT MATERIAL

FIELD OF THE INVENTION

The present invention relates to forming a low dielectric constant layer suitable for use in semiconductor devices. The present invention has particular applicability to the formation of interlevel dielectric layers in multilevel semiconductor devices.

BACKGROUND OF THE INVENTION

The escalating requirements for high density and performance associated with ultra-large scale integration semiconductor devices necessitate design features of 0.18 micron and under, increased transistor and circuit speeds, high reliability, and increased manufacturing throughput. The reduction of design features to 0.18 micron and under challenges the limitations of conventional interconnection technology, such as the electrical isolation properties of interlevel dielectric (ILD) materials.

A problem encountered in highly miniaturized semiconductor devices employing multiple levels and reduced interwiring spacings in both the horizontal and vertical dimensions is related to the resistance-capacitance (RC) time constant of the system. Although semiconductor devices are presently being scaled in the horizontal dimension, they are not generally scaled in the vertical dimension, since scaling in both dimensions would lead to a higher current density that could exceed reliability limits. Horizontal scaling, however, requires conductive lines having a high aspect ratio, i.e., ratios of conductor height to conductor width greater than one, e.g., three or four, along with reduced interwiring spacings. As a consequence, capacitive coupling between conductive lines becomes a significant limitation on circuit speed. If intrametal capacitance is high, electrical inefficiencies and inaccuracies increase. It has been recognized that a reduction in capacitance within multi-level system will reduce the RC time constant between the conductive lines.

The drive towards increased miniaturization and the resultant increase in the RC time constant have served as an impetus for the development of newer, low dielectric constant ("low k") materials as substitutes for conventional higher dielectric constant silicon oxide-based ILD materials. However, such dielectric materials must be able to serve a number of different purposes requiring diverse characteristics and attributes. For example, the ILD material must: prevent unwanted shorting of neighboring conductors or conducting levels by acting as a rigid, insulating spacer; prevent corrosion and/or oxidation of metal conductors, by acting as a barrier to moisture and mobile ions; fill deep, narrow gaps between closely spaced conductors; and undergo planarization of uneven surface topography so that a relatively flat level of conductors can be reliably deposited thereon. In addition, ILD films or layers must be formed at relatively low temperatures (i.e. no greater than about 450° C.) to avoid damage to or destruction of underlying conductors. Another, and important consideration in regard to RC time constant effects, is that such dielectric films used as ILD materials must have a low dielectric constant, as compared to the value of 4.1 to 3.9 for a conventionally employed silicon dioxide ($SiO_2$) layer, in order to reduce the RC time constant, lower power consumption, reduce crosstalk, and reduce signal delay in closely spaced conductors.

Silicon oxide has found the widest application as ILD layers in multilevel interconnect technology partly because of the familiarity and varied methods for depositing silicon oxide layers pervasive in semiconductor manufacturing processes. Silicon oxide as ILD layers can be deposited by any number of processes, including chemical vapor deposition (CVD), plasma enhanced CVD and liquid spin-on glass forming techniques, tailored to achieving high-quality ILDs characterized by good electrical and physical properties. Accordingly, it would be highly advantageous to utilize current techniques of forming silicon oxide as ILDs with an improved lower dielectric constant to further reduce device features.

It has been observed in the art of virtrified fission products that radiation can cause decomposition of the lattice structure of a silicate glass resulting in the formation of bubbles within the glass. DeNatale et al. "Importance of Ionization Damage to Nuclear Waste Storage in Glass", Ceramic Bulletin (1987) 66, 1393–1396; Howitt et al. "Mechanism for the Radiolytically Induced Decomposition of Soda-silicate Glasses", J. Am. Ceram. Soc. (1991) 74, 1145–1147. Efforts in the art of virtrified fission products, however, attempt to improve or ameliorate the decomposition of glasses exposed to radiation from waste nuclear material primarily by reducing the bubble or void formation in the glass thereby improving long-term storage capability of the virtrified waste products. See, e.g. De et al. "Development of Glass Ceramics for the Incorporation of Fission Products", Ceramic Bulletin (1976) 55, 500–503.However, it is believed that a process for achieving beneficial electrical properties of irradiated glasses has not been recognized or undertaken within the semiconductor manufacturing art.

Baglin et al., in U.S. Pat. No. 4,001,049, disclose a method for improving the dielectric breakdown strength of an amorphous silicon dioxide ($SiO_2$) film by ion implantation in conjunction with an annealing treatment of the film. The $SiO_2$ films are reported to be highly densified, lacking micropores and particularly applicable to thin gate oxide structures. ILD layers, however, differ significantly in desired properties and structures from that of oxide films used in field effect transistors. For example, ILD layers can not be exposed to high temperatures without damage to or destruction of underlying conductors. Moreover, the dielectric strength of the ILD is less important since the ILD primarily functions to electrically isolate conductive layers and not under a high capacitive environment.

Thus, there exists a need for utilizing current techniques of depositing ILD layers but improving the dielectric constant thereof, particularly as employed in the manufacture of ultra large scale integration semiconductor devices having multiple levels.

DISCLOSURE OF THE INVENTION

An advantage of the present invention is a semiconductor device having a low dielectric material between conductive layers.

A further advantage of the present invention is a process for reducing the dielectric constant of a dielectric layer.

Additional advantages, and other features of the present invention will be set forth in the description which follows and in part will become apparent to those having ordinary skill in the art upon examination of the following or may be learned from the practice of the present invention. The advantages may be realized and obtained as particularly pointed out in the appended claims.

According to the present invention, the foregoing and other advantages are achieved in part by a semiconductor device comprising: a first conductive layer; a dielectric layer on the first conductive layer; and a second conductive layer on the dielectric layer, wherein the dielectric layer has voids therein. It is advantageous for the voids to be substantially uniform throughout the dielectric layer thereby reducing the dielectric constant of the layer.

Another aspect of the present invention is a method of forming a layer of low dielectric constant material on a substrate. The method comprises: depositing a dielectric layer on the substrate; and ion implanting inert elements into the dielectric layer to form voids in the dielectric layer, thereby reducing the dielectric constant of the dielectric layer.

Additional advantages of the present invention will become readily apparent to those skilled in this art from the following detailed description, wherein only the preferred embodiments of the present invention are shown and described, simply by way of illustration but not limitation. As will be realized, the invention is capable of other and different embodiments, and its several details are capable of modification in various obvious respects, all without departing from the spirit of the present invention. Accordingly, the drawings and description are to be regarded as illustrative in nature, and not as restrictive.

BRIEF DESCRIPTION OF THE DRAWINGS

The following detailed description of the embodiments of the invention can best be understood when read in conjunction with the following drawing, wherein.

DESCRIPTION OF THE INVENTION

The present invention stems from the discovery that the dielectric constant of a material can be reduced by exposing the material to ionic, electronic or gamma radiation treatment. Controlled irradiation of a material to ionic radiation, for example, causes decomposition of the material's lattice structure and penetration of the ions into the material potentially trapping the ions and any gaseous decomposition products formed therein. Initially, it is believed that the irradiated ions form voids within the lattice structure of the material at a sub-nanometer scale. Continued ion bombardment increases the size of the voids in the structure to ultimately form a porous material. Electronic or gamma radiation treatment of a material also leads to a porous structure by promoting decomposition of the material subject to such radiation thereby causing gaseous decomposition products to form bubbles within the material. It has been discovered that by irradiating a dielectric layer in the manufacture of a semiconductor device, a lower dielectric constant of the treated dielectric layer can be achieved.

The present invention advantageously exploits the low resistivity property of a porous layer to electrically isolate devices or to define non-conductive boundaries, such as inter-level dielectric layers. It is important to note that the irradiated material can only be used in a process that will no longer subject the irradiated material to a temperature in excess of its melting temperature or deformation temperature thereby reversing the porous structure by thermal densification or by any other densification resulting process. Accordingly, the present invention is advantageously employed in the formation of inter-level dielectric layers, where a low dielectric constant material is highly desirable and where high temperatures are prohibited.

Figure 1:
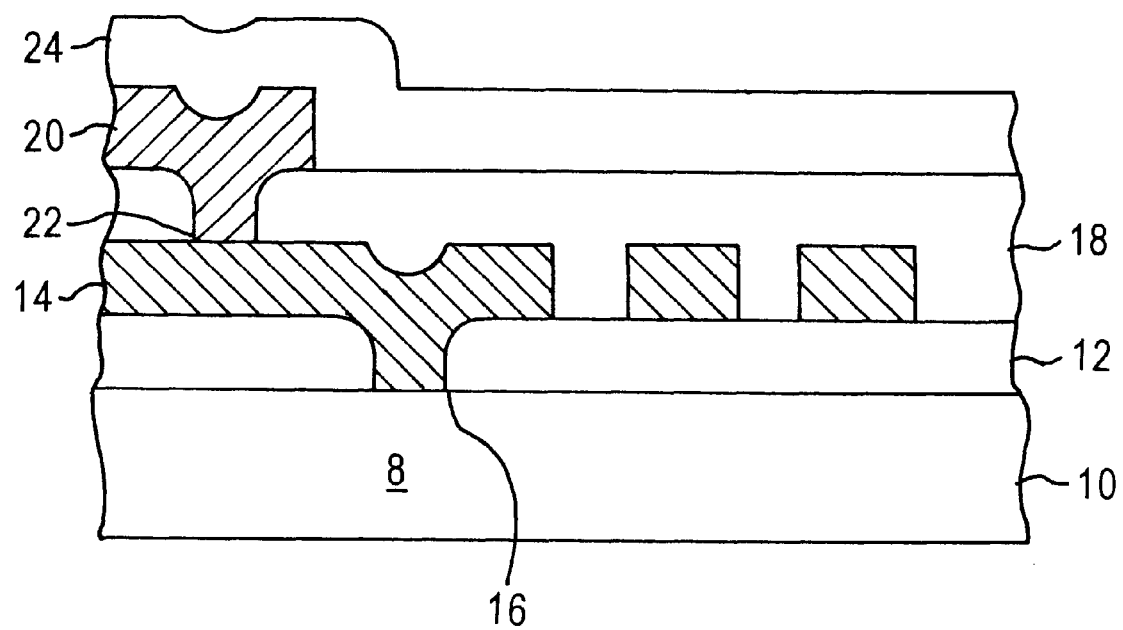
FIG. 1 is a cross-sectional view schematically illustrating a multilevel interconnect structure.

Referring now to FIG. 1, shown therein is a cross-sectional schematic view of an interconnect structure on semiconductor substrate 10. Semiconductor substrate 10 typically comprises monocrystalline silicon, with conductive contacts formed therein for electrical connection with at least one active region 8 formed in or on the substrate, such as a source/drain region of a transistor (not shown for illustrative convenience). Base insulator film 12 overlays substrate 10 and first conductive layer 14 overlays base insulator film 12. The first conductive layer functions to interconnect active regions on or in semiconductor substrate 10 by providing electrical contact with the substrate (or active regions thereon) through connection holes as, for example, via 16, and is formed on base insulator film 12 with predetermined spaces between conductive lines. The first conductive layer 14 is covered with inter-level dielectric layer 18, which provides electrical isolation between conductive areas. Second conductive layer 20 overlays inter-level dielectric 18 and is connected to first conductive layer 14 through via 22. Passivation layer 24 is formed over the entire structure covering second conductive layer 20 and inter-level dielectric 18 to protect and seal the structure from the external environment.

In multi-level interconnection structures, as shown in FIG. 1, the limitations of interwiring spaces in both the horizontal and vertical dimension is strongly dependant upon the dielectric constant of the inter-level dielectric layer. Surprisingly, it has been discovered that the dielectric constant of a deposited dielectric layer can be subsequently manipulated by forming a porous structure thereof thereby permitting the use of current deposition techniques of current dielectric materials with improved dielectric constant properties.

Figure 2:
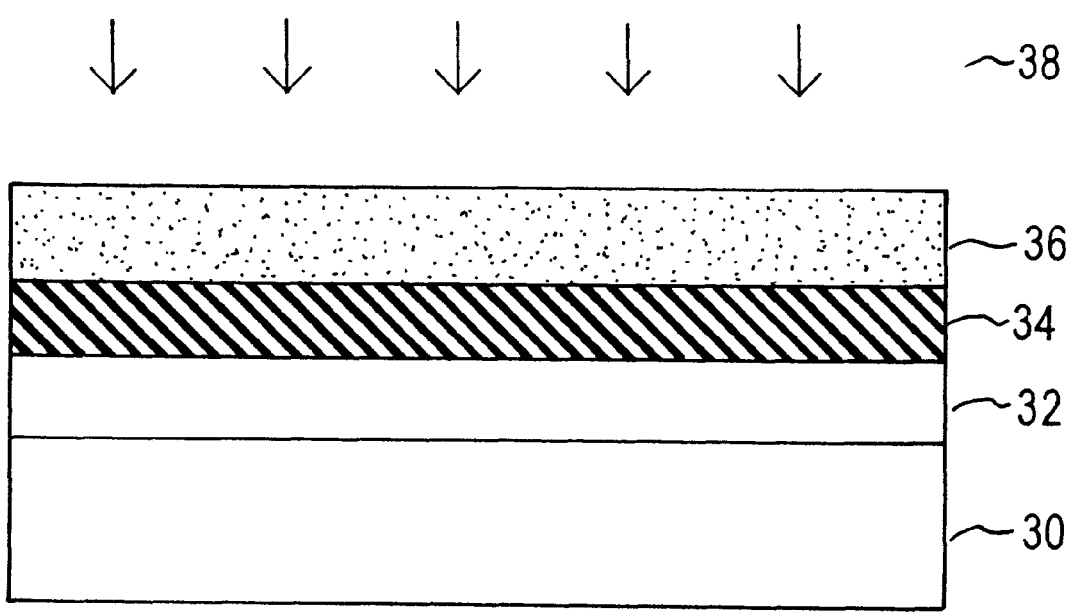
FIG. 2 schematically illustrates is a cross-sectional view of an interconnect structure in accordance with the present invention.

In accordance with the present invention, FIG. 2 schematically illustrates an interconnect structure having substrate 30, base insulator layer 32 thereon and a composite layer comprising a first conductive layer 34 on base insulator layer 32 and an ILD layer 36 on conductive layer 34. Base insulating layer 32 is formed by conventional insulating layer techniques including, for example, deposition and patterning of a layer comprising silicon dioxide and is about 1,000 Å to about 10,000 Å. In very large scale inter-circuit applications, base layer 32 has several thousand openings which can be either vias or lateral metalization lines where the metalization pattern serves to interconnect structures on or in the semiconductor substrate (not shown for illustrative convenience).

First conductive layer 34 is formed by depositing a conductive layer over base insulating layer 32. The first conductive layer typically comprises a metal layer such as aluminum, copper, titanium, binary alloys, ternary alloys, such as Al—Pd—Cu, Al—Pd—Nb, Al—Cu—Si or other similar low resistivity metal or metal based alloys. First conductive layer 34 can comprise a composite of a plurality of layers, for example, a composite conductive layer can comprise a first layer comprising a copper-titanium-nitride alloy at a thickness of about 1,100 Å deposited by vacuum deposition. A second layer comprising aluminum at a thickness of about 5,000 Å is deposited on the copper-titanium nitride also by vapor deposition. Conductive layer 34 can be patterned using photolithographic masking and etching techniques to form a desired conductive pattern comprising metal features separated by gaps, such as a plurality of metal lines with interwiring spacings therebetween.

In accordance with the present invention, ILD 36 can be a doped chemical vapor deposited oxide, nitride, oxynitride, polyimide, or a spin-on glass and is formed at a thickness of about 0.3 microns to about 1 micron. ILD layer can also be deposited by a low temperature plasma enhanced chemical vapor deposition process depositing a silicon oxide film from an organosilicon compound as, for example, an alkoxysilane such as tetraethyl orthosilicate (TEOS). Alternatively, an oxide layer can be formed by liquid spin-on oxide forming techniques. In an embodiment of the present invention, ILD layer 36 is deposited by a high density plasma TEOS film forming technique.

In accordance with the present invention, ILD layer 36 is bombarded with specific ions 38 at a suitable energy and dosage to form sub-nanometer size holes or micropores substantially throughout the irradiated layer. It is believed that the implanted ions break chemical or Van der Waals bonding within the lattice structure when passing through the interlevel dielectric material and combine in the voids ultimately forming a porous structure encapsulating the implanted ions as gaseous atoms. The voids may additionally contain decomposition products of the dielectric layer, such as oxygen, hydrogen, etc.

In accordance with the present invention, an ILD layer is ion bombarded with an element selected from the group consisting of helium, neon, argon, krypton, xenon, deuterium and hydrogen. Ion implantation energies are chosen such that no significant portion of the ions penetrate underlying conductive layer 34 or otherwise penetrate unintended layers in the semiconductor substrate. In an embodiment of the present invention, ILD layer 36 is subjected to one or more ion bombardments of gaseous ions at a dose of about $1\times10^{10}$ atoms/cm$^2$ to about $1\times10^{20}$ atoms/cm$^2$, e.g. of about $10^{12}$ atoms/cm$^2$ to about $10^{16}$ atoms/cm$^2$ and an implantation energy of about 1 KeV to about 300 KeV.

Ions of a particular energy and dosage are chosen so that a high density of voids of a particular size are formed substantially throughout the exposed area. In an embodiment of the present invention, ionic bombardment of the ILD layer results in pores or voids having a diameter of about 100 Å to about 1000 Å, or a reduced density of about 10% to 80% of the original ILD material. Alternatively stated, the radiation treated ILD layer results in a porous structure having a porosity of about 10% to as low as about 80%.

Depending on post treatment of the ILD layer, e.g., heating or subjecting the ILD to reduced pressure, the gaseous ions can diffuse out of the ILD layer leaving in place a porous structure. It should be noted, however, that to maintain the porous structure of ILD, ionic irradiation and post treatment must be maintained at a temperature no greater than the flow temperature of the ILD material. In an embodiment of the present invention, ion implantation of the ILD is conducted at a temperature no greater than about 450° C., e.g. no greater than about 350° C.

In an embodiment of the present invention, an ILD comprising a silicon oxide layer, e.g. a silicon dioxide layer, is placed into an ion implantation chamber maintained at about room temperature, i.e. about 20° C. The silicon oxide layer is then subjected to ionic radiation by implanting helium ions into the layer at a dosage of about $1\times10^{16}$ atoms/cm$^2$ having an implantation energy of about 10 KeV to about 100 KeV. The gaseous ions are selected to penetrate the silicon oxide layer and form voids therein resulting in a highly porous structure, thereby lowering the dielectric constant of the silicon oxide layer. ILD layers produced by the forgoing process in accordance with the present invention can exhibit a dielectric constant of less than about 3.9, e.g. of about 2 to about 3.8. For example, a silicon dioxide layer having a porosity of about 15% is expected to have a dielectric constant of about 3.5 and a silicon dioxide layer having a porosity of about 48% is expected to have a dielectric constant of about 2.5.

The surface of the ILD layer can then be planarized by conventional etching or chemical-mechanical polishing (CMP) techniques. A through-hole can be formed in the ILD layer to expose a selected portion of an underlying metal feature, the exposed portion of the metal feature at the bottom of the through-hole serving as a contact pad. Upon filling the through-hole with conductive material, such as a metal plug, to form a conductive via, the bottom surface of the conductive via is in electrical contact with the underlying metal feature.

A second conductive layer comprising a composite including aluminum, copper, titanium or alloys thereof can then be deposited on the ILD layer and patterned using photolithographic masking and etching techniques to form a second conductive pattern comprising second metal features separated by gaps, such as a plurality of metal lines with interwiring spacings therebetween. Because many ultra large scale integration devices presently manufactured are very complex and require multiple levels of metalization for interconnections, it has been common to repeat the above-described conductive-ILD layer formation process multiple times, e.g., to form third, four, fifth, or more conductive levels interconnected by conductive vias, each conductive level of metalization separated by at least one layer of an irradiated ILD layer.

The present invention enjoys particular applicability in manufacturing multilevel semiconductor devices, notably in forming low dielectric constant ILD layers. The present invention is applicable to various phases of semiconductor manufacturing wherein an interconnect metallization pattern is formed including an irradiated ILD layer, particularly an interconnect metallization pattern having 0.18$\mu$ geometry and under. Such patterns comprise, for example, the formation of aluminum, aluminum alloy copper and copper interconnections.

Only the preferred embodiment of the present invention and an example of its versatility is shown and described in the present disclosure. It is to be understood that the present invention is capable of use in various other combinations and environments and is capable of changes or modifications within the scope of the inventive concept as expressed herein.

What is claimed is:

1. A semiconductor device comprising:

a first conductive layer;

a dielectric layer having a dielectric constant on the first conductive layer; and a second conductive layer on the dielectric layer, wherein the dielectric layer contains voids having a diameter of about 100 Å to about 1,000 Å substantially throughout the dielectric layer, thereby lowering the dielectric constant of the dielectric layer, wherein the dielectric layer comprises a silicon oxide layer, wherein the silicon oxide layer contains implanted atoms selected from the group consisting of helium, neon, argon, krypton, xenon, deuterium and hydrogen ions, and wherein the silicon oxide layer has a porosity of about 15%.

2. The semiconductor device of claim 1, wherein the dielectric constant of the dielectric layer is no greater than about 3.9.

3. The semiconductor device of claim 1, wherein the first conductive layer is over a single crystal silicon substrate having at least one active device region.

4. The semiconductor device of claim 1, wherein the first conductive layer comprises a metal, the dielectric layer is directly on the first conductive layer and the second conductive layer comprises a metal and is directly on the dielectric layer.

* * * * *